(12) United States Patent
Nishiyama

(10) Patent No.: US 6,816,522 B2
(45) Date of Patent: Nov. 9, 2004

(54) SEMICONDUCTOR LASER APPARATUS AND METHOD FOR MANUFACTURING THE SAME

(75) Inventor: Nobuhiro Nishiyama, Habikino (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/315,195

(22) Filed: Dec. 10, 2002

(65) Prior Publication Data

US 2003/0108073 A1 Jun. 12, 2003

(30) Foreign Application Priority Data

Dec. 10, 2001 (JP) ........................................ 2001-376002

(51) Int. Cl.[7] .............................. H01S 3/04; H01S 5/00
(52) U.S. Cl. .......................................... 372/36; 372/43
(58) Field of Search .............................. 372/36, 43–49; 257/675, 707

(56) References Cited

U.S. PATENT DOCUMENTS

| | | | | |
|---|---|---|---|---|
| 4,338,577 A | * | 7/1982 | Sato et al. ..................... 372/36 |
| 4,403,243 A | * | 9/1983 | Hakamada .................. 257/772 |
| 4,877,756 A | * | 10/1989 | Yamamoto et al. ........... 438/25 |
| 5,068,866 A | * | 11/1991 | Wada et al. .................... 372/36 |
| 5,089,861 A | * | 2/1992 | Tanaka et al. ................. 372/36 |
| 5,140,384 A | * | 8/1992 | Tanaka ......................... 257/99 |
| 5,307,362 A | * | 4/1994 | Tanaka et al. ................. 372/50 |
| 5,309,460 A | * | 5/1994 | Fujimaki et al. .............. 372/36 |
| 5,327,443 A | * | 7/1994 | Tanaka et al. ................. 372/36 |
| 5,355,385 A | * | 10/1994 | Amano et al. ................. 372/49 |
| 5,367,530 A | * | 11/1994 | Noishiki et al. ............... 372/43 |
| 5,444,726 A | * | 8/1995 | Kitamura et al. ............. 372/36 |
| 5,485,479 A | * | 1/1996 | Kitamura et al. ............. 372/43 |
| 5,590,144 A | * | 12/1996 | Kitamura et al. ............. 372/36 |
| 5,614,735 A | * | 3/1997 | Kitamura et al. ............. 257/99 |
| 5,825,794 A | * | 10/1998 | Ogino et al. .................. 372/36 |
| 6,181,720 B1 | * | 1/2001 | Kanemoto et al. ............ 372/43 |
| 2002/0071461 A1 | * | 6/2002 | Nishiyama .................... 372/36 |

FOREIGN PATENT DOCUMENTS

| | | | |
|---|---|---|---|
| JP | 63-193874 | 12/1988 | |
| JP | 04-280487 | 10/1992 | |
| JP | 04280487 A | * 10/1992 | ............. H01S/3/18 |
| JP | 07-335980 | 12/1995 | |
| JP | 09139541 A | * 5/1997 | ............. H01S/3/18 |
| JP | 2001-230482 | 8/2001 | |

* cited by examiner

*Primary Examiner*—Don Wong
*Assistant Examiner*—Phillip Nguyen
(74) *Attorney, Agent, or Firm*—Morrison & Foerster LLP

(57) ABSTRACT

A base frame, a laser device mounting frame, and a lead frame are formed by stamping and bending one metal plate. A reference plane is constituted by reference plane portions of the flat base frame, and metal plates for heat dissipation and reinforcement are further attached to the reference plane to provide high strength and heat dissipation though the present apparatus is a flame type laser apparatus. Also, a laser device is mounted on the laser device mounting frame, and the surrounding thereof except the light emitting side is molded with a mold resin. This eliminates the need for a cap for protecting the laser device and a wire, and enables collective production. More specifically, collective mass production is enabled by forming a frame by stamping out from one metal plate and molding the frame with resin without use of a cap.

15 Claims, 5 Drawing Sheets

SEMICONDUCTOR LASER APPARATUS AND METHOD FOR MANUFACTURING THE SAME

BACKGROUND OF THE INVENTION

The present invention relates to a semiconductor laser apparatus for use as a light source for reading signals from optical discs including CD (Compact Disc), CD-R (CD Recordable), DVD (Digital Versatile Disc) and DVD-R (DVD Recordable), and a method for manufacturing the same.

Conventionally, as an assembly structure of the semiconductor laser apparatus, there have been a frame type laser apparatus and a Φ5.6 can type laser apparatus. Hereinbelow, the both apparatuses will be roughly described.

Figure 5:
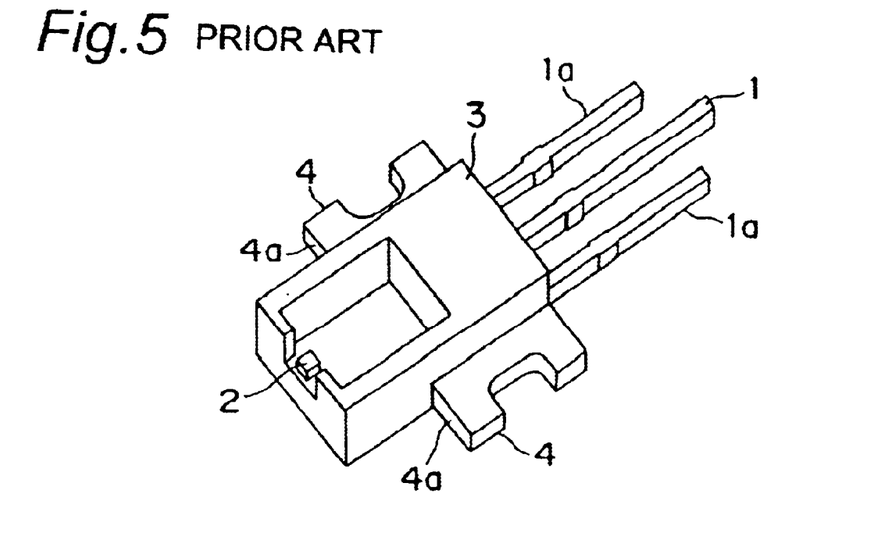
FIG. 5 is a view showing a conventional frame type laser apparatus having a metal reference plane.

(1) Frame Type Laser Apparatus (1) As shown in FIG. 5, the apparatus is structured such that on the top end of a metal lead frame 1 functioning as a lead terminal, a laser device 2 is mounted, and a mold resin 3 is used for molding. Part of a lead frame 1a positioned in both side portions is protruded from the lateral face of the mold resin 3 to lateral direction to constitute a plate-shaped portion 4, and one end face 4a of the plate-shaped portion 4 constitutes a reference plane (eyelet).

Figure 6:
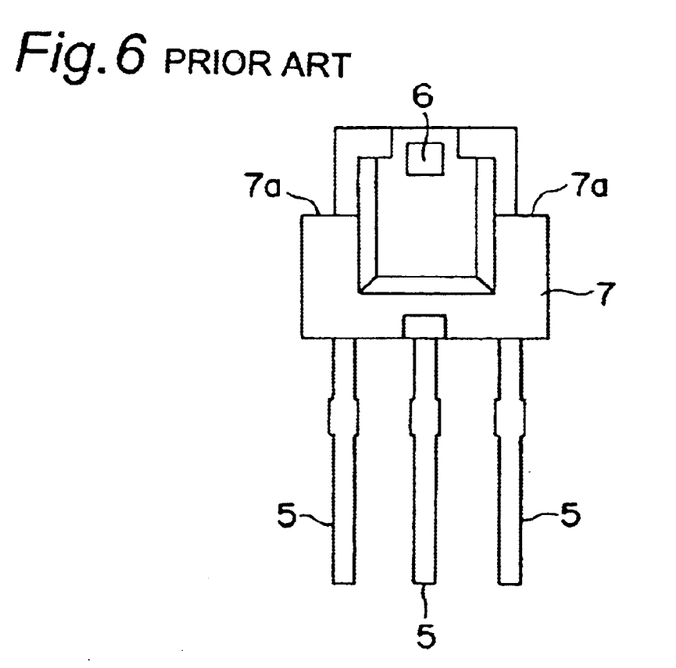
FIG. 6 is a view showing a conventional frame type laser apparatus having a resin reference plane.

(2) As shown in FIG. 6, similar to the case (1), the apparatus is structured such that on the top end of a metal lead frame 5 functioning as a lead terminal, a laser device 6 is mounted, and a mold resin 7 is used for molding. In this case, one end face 7a of the mold resin 7 constitutes a reference plane (eyelet).

(2) Φ5.6 Can Type Laser Apparatus

Figure 7:
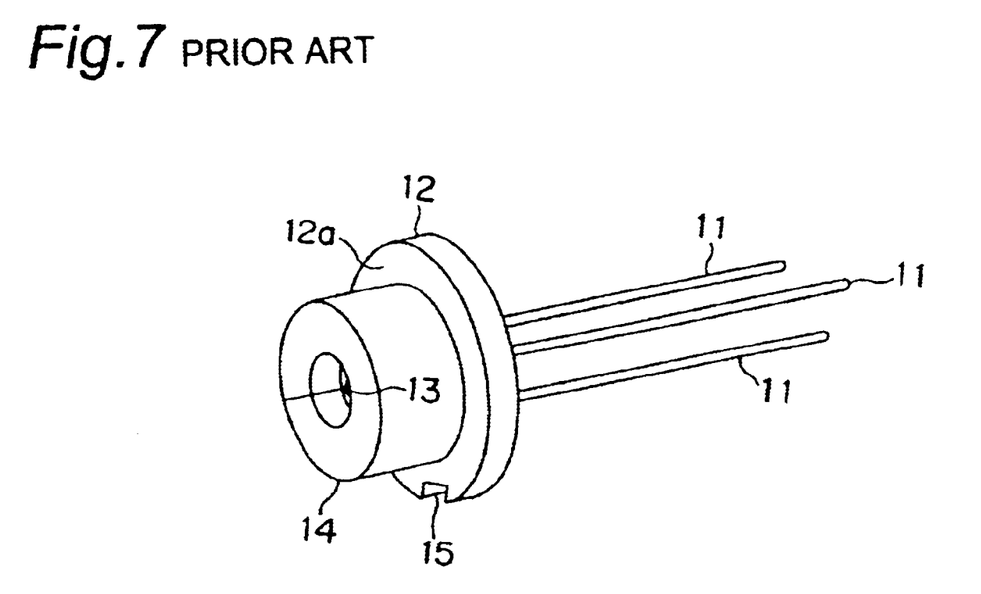
FIG. 7 is a view showing a conventional Φ5.6 can type laser apparatus.

As shown in FIG. 7, the apparatus is structured such that a laser device 13 is mounted, via a heat sink (unshown), on a top face 12a of a stem 12 made of a circular metal block having a lead terminal 11 protruding from a bottom face, and after the laser device 13 is wire-bonded to the lead terminal 11, the laser device 13 and a wire (unshown) are covered with a protecting cap 14. In this case, the top face 12a of the stem 12 constitutes a reference plane. It is noted that reference numeral 15 denotes a cutting for positioning.

However, the above-described conventional assembly structures of the semiconductor laser apparatuses suffer a following problem.

(a) Frame Type Laser Device (i) In the case of the frame type laser apparatus as shown in FIG. 5, the plate-shaped portion 4 protruding from the lateral face of the mold resin 3 has a constant thickness. Consequently, the area of the reference plane constituted by the one end face 4a of the plate-shaped portion 4 is determined by the thickness of the plate-shaped portion 4, which causes a problem that the strength of the reference plane is not fully secured and therefore heat dissipation is not sufficient.

(ii) In the case of the frame type laser apparatus as shown in FIG. 6, the reference plane is constituted by the one end face 7a of the mold resin 7. Consequently, there is a problem that the reference plane is lower in strength than that of a metal reference plane, and also the reference plane has expansion and shrinkage due to temperature change, which decreases accuracy as a reference plane. Further, there is another problem that heat dissipation is not fully secured as it is limited by the thickness of the lead frame 5.

(b) Φ5.6 Can Type Laser Apparatus

As shown in FIG. 7, the reference plane and the heat dissipation portion are constituted by one plane of a metal block called the stem 12. Consequently, the strength and the heat dissipation of the reference plane is superior to those of the above-described frame type laser apparatus. However, since assembly is conducted by using the cap 14 for protecting the laser device 13 and the wire against the stem 12 made of a circular metal block, individual manufacturing is necessary whether in the case of a package itself or a final product, which decreases productivity and makes the apparatus unsuitable for mass collective production

SUMMARY OF THE INVENTION

Accordingly, it is an object of the present invention to provide a semiconductor laser apparatus capable of securing sufficient strength and heat dissipation of a reference plane and excellent in productivity, and to provide a method for manufacturing the same.

In order to achieve the above object, there is provided a semiconductor laser apparatus comprising: a base frame; a laser device mounting frame extensively disposed on one side of the base frame; and a lead frame extensively disposed on the other side of the base frame, all structured by one metal plate, wherein the laser device mounting frame and the lead frame are bended so as to be opposite to each other against a plane of the base frame, the base frame functions as a reference plane and a heat sinking base, a semiconductor laser device is mounted on the laser device mounting frame, and the lead frame becomes a lead terminal.

According to the above structure, the base frame functioning as a reference plane and as a heat sinking base is formed by bending a laser device mounting frame and a lead frame, which are structured together with the base from one metal plate, so that the laser device mounting frame and the lead frame are opposite to each other against the base frame. Therefore, the area of the reference plane and the heat sinking plane may be arbitrarily set by changing the bending position. This provides the frame type laser apparatus with high heat dissipation competing with that of Φ5.6 can type laser apparatus.

Further, since the apparatus is a frame type laser apparatus, structuring plural sets of the laser device mounting frame, the base frame, and the lead frame in a multiple form enables collective packaging in large quantities, resulting in increase of productivity. Further, manufacturing of a final product may be performed in a multiple form, which enables further increase of productivity and enables manufacturing at low costs.

In one embodiment of the present invention, a configuration of the base frame is an approximate circle or an approximate oval partially in a shape of a circular arc.

According to this embodiment, the configuration of the base frame is an approximate circle or an approximate oval shape, which may provide strength and heat dissipation competing with those of the stem in the Φ5.6 can type laser apparatus.

In one embodiment of the present invention, an optical axis of laser light from the semiconductor laser device mounted on the laser device mounting frame has an extension line traveling through an approximate center of the configuration of the base frame.

According to this embodiment, in addition to the fact that a configuration of the base frame is an approximate circle or partially a circular arc, the optical axis is not displaced when a mounting position is adjusted by rotating the base frame, which considerably simplifies adjustment of a mounting position.

In one embodiment of the present invention, at least a portion of the base frame to be the reference plane and the heat sinking base has an increased thickness.

According to this embodiment, a portion to be the reference plane and the heat sinking base has an increased thickness. This implements further increase of the strength and the heat dissipation of the reference plane.

In one embodiment of the present invention, on the base frame, there is formed a component protecting partition made of resin so as to surround the semiconductor laser device excluding a laser emitting side.

According to this embodiment, there is formed a component protecting partition so as to surround the semiconductor laser device. Therefore, though the apparatus is an open package, the semiconductor laser device, the wire, and the like are protected from careless touch. Further, the component protecting partition is structured not from a cap but a resin, so that collective packaging in large quantities is achieved.

In one embodiment of the present invention, the resin structuring the component protecting partition is formed with at least part of the laser device mounting frame and the lead frame being embedded therein, and the laser device mounting frame and the lead frame bended toward the base frame are fixed by the resin.

According to this embodiment, at least part of the laser device mounting frame and the lead frame are fixed by the resin. Consequently, the laser device mounting frame and the lead frame structured by bending one metal plate is free from flexion and the like, which may increase mounting rigidity.

In one embodiment of the present invention, a top end portion of the separated lead frame is inserted into the resin that constitutes the component protecting partition, and the top end portion is equipped with slip out preventing means for preventing slip out of the lead frame from the resin.

According to this embodiment, the lead frame electronically separated from the lead frame integrally formed with the base frame is fixed to a resin block of the component protecting partition. This increases mounting rigidity.

In one embodiment of the present invention, a positioning recess portion is provided on an outer circumferential edge of the base frame.

According to this embodiment, positioning for adjusting a mounting position by rotating the base frame is easily performed with the positioning recess portion on an outer circumferential edge.

In one embodiment of the present invention, the base frame, the laser device mounting frame and the lead frame that are formed integrally are formed from a copper plate or an iron plate whose surface is plated with gold or silver.

According to this embodiment, the base frame, the laser device mounting frame and the lead frame that are integrated are formed from a conductive metal plate made of copper or iron. This enables the lead frame to function as a lead terminal as it is. Further, plating the surface with gold or silver implements good wire-bonding of the semiconductor laser device to the lead frame.

Also, there is provided a method for manufacturing a semiconductor laser apparatus comprising the steps of:

forming plural groups of frames connected by a casing frame and a tie-bar from one metal plate, the group composed of a base frame, a laser device mounting frame extensively disposed on one side of the base frame, a first lead frame extensively disposed on the other side of the base frame, and a second frame separated from the first lead frame;

bending the laser device mounting frame and the first lead frame in each group so as to be opposite to each other against the base frame;

mounting the semiconductor laser device on the laser device mounting frame in each group, and then wire-bonding the semiconductor laser device to the first and second lead frames; and forming a component protecting partition from resin on the base frame in each group so as to surround the semiconductor laser device excluding a laser emitting side.

According to the above method, plural groups of frames consisting of a laser device mounting frame, a base frame, first and second frames connected via a casing frame and a tie-bar are formed from one metal plate, and each group simultaneously undergoes the steps of forming, mounting of a semiconductor laser device, wire-bonding, and resin-molding. This enables collective mass production of a plurality of semiconductor laser apparatuses having high strength and heat dissipation of the reference plane in the form of final products, thereby implementing increase of productivity and reduction of costs.

In one embodiment of the present invention, forming of frames from one metal plate is conducted by stamping with use of a mold.

According to this embodiment, forming of the frames becomes easier and productivity is further increased.

In one embodiment of the present invention, the method further comprises the step of providing a groove in a bending portion of each frame in advance of the step of bending the laser device mounting frame and the first lead frame.

According to this embodiment, bending of the laser device mounting frame and the first lead frame in the forming process is simplified, which implements further increase of productivity.

In one embodiment of the present invention, bending of the laser device mounting frame and the first lead frame is conducted with use of a mold.

According to this embodiment, bending of the laser device mounting frame and the first lead frame in a plurality of groups is collectively conducted with use of a mold, which implements increase of productivity.

In one embodiment of the present invention, the method further comprises the step of attaching a metal plate to at least a portion of the base frame to be a reference plane and a heat sinking base, the metal plate having a form identical to the portion.

According to this embodiment, a portion to be the reference plane and the heat sinking base is given an increased thickness. This further increases strength and heat dissipation of the reference plane.

In one embodiment of the present invention, the method further comprises the step of decreasing a thickness of a portion other than the portion of the base frame to be the reference plane and the heat sinking base, a thickness of the laser device mounting frame, and a thickness of the first lead frame by pressing.

According to this embodiment, processing for increasing the thickness in order to increase strength and heat dissipation of the reference plane for plural groups of frames is achieved by one operation of pressing. Therefore, productivity is increased more than the case of attaching a metal plate as shown in the antecedent embodiment.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
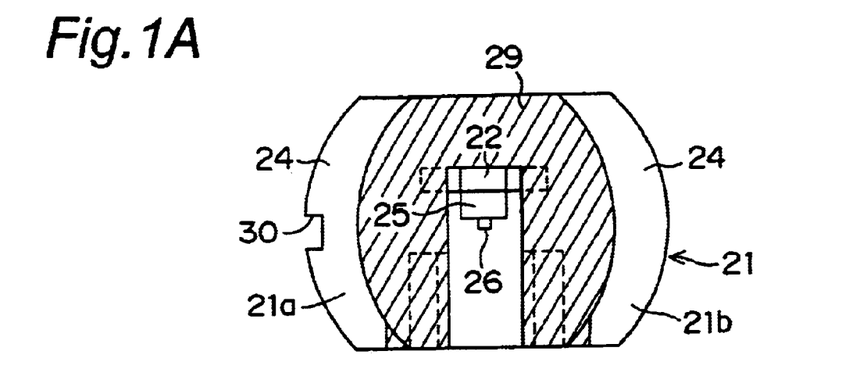
FIGS. 1A to 1C are views of a semiconductor laser apparatus of the present invention.
Figure 1B:
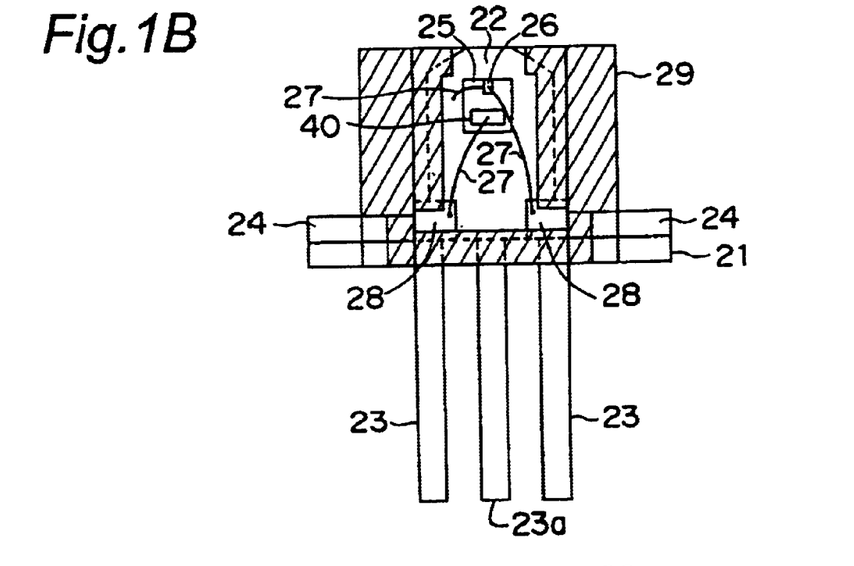
Figure 1C:
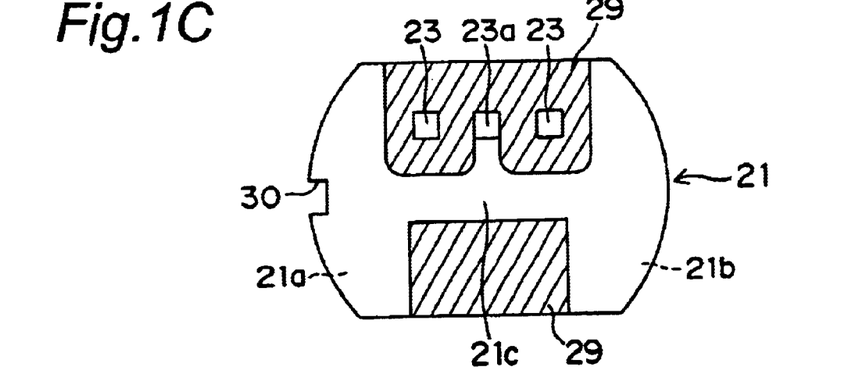

Hereinbelow, the present invention will be described in detail on the basis of the embodiment shown in the drawings. FIG. 1A is a plane view, FIG. 1B is a front view, and FIG. 1C is a bottom view.

This semiconductor laser apparatus, which may be compatible with a Φ5.6 can type laser apparatus of FIG. 7 that is currently a mainstream apparatus, has a reference plane with increased strength and heat dissipation that used to be difficult to achieve in frame type laser apparatuses. Also, though in the form of an open package without use of a cap, the apparatus is equipped with a component protecting partition for protecting a mounted laser device, wires and the like, which implements a structure protected from careless touch.

Reference numeral 21 denotes a base frame composed of approximately semilunar reference plane portions 21a, 21b disposed so as to be opposed to each other, one side of which is in the shape of a circular arc, and a plate-shaped connecting portion 21c for connecting the center of the straight other sides of the both reference plane portions 21a, 21b, the base frame being formed from one metal plate. Also, a plate-shaped laser device mounting frame 22 is extensively provided from one side portion of the connecting portion 21c of the base frame 21 in vertical direction against the surface of the connecting portion 21c. From the other side portion of the connecting portion 21c, three lead frames 23 are extensively provided in vertical direction against the surface of the connecting portion 21c. Here, the laser device mounting frame 22 and a central lead frame 23a are structured such that they are integrally formed with the base frame 21, and bended at a side edge of the connecting portion 21c at right angles so as to be opposite to each other. More specifically, the laser device mounting frame 22, the base frame 21, and the lead frame 23a are structured by stamping and bending one metal plate.

Also, to the reference plane portions 21a, 21b of the base frame 21, there are attached metal plates 24, 24 having the same form for heat dissipation and reinforcement.

On the laser device mounting frame 22, there is mounted a submount 25 on which a laser device 26 and a light receiving device 40 are mounted, and the submount 25 is wire-bonded to wire-bonding portions 28, 28 of the lead frames 23, 23 by wires 27, 27. The surrounding of the laser device mounting frame 22 with the laser device 26 mounted thereon except the laser light emitting side is molded by a mold resin 29 as shown with a slanted line. Thus, the mold resin 29 constitutes the component protecting partition. It is noted that reference numeral 30 denotes a positioning recess portion formed on the outer circumferential edge of the base frame 21.

As described above, the semiconductor laser apparatus according to the present embodiment has the base frame 21, the laser device mounting frame 22, and the lead frame 23 formed by stamping and bending of one metal plate, and the laser device 26 is mounted on the laser device mounting frame 22. A reference plane is constituted by the reference plane portions 21a, 21b of the base frame 21 formed from one plane metal plate in the shape of an approximate oval a part of which is circular arc. Further, to the reference plane portions 21a, 21b, the metal plates 24, 24 having the form identical thereto are attached for heat dissipation and reinforcement. Therefore, though it is a frame type laser device, the semiconductor laser apparatus may obtain high reference plane strength and heat dissipation competing with the stem in the Φ5.6 can type laser apparatus. Also, the strength and the heat dissipation may be freely changed by changing a stamping form of the base frame 21 and a bending position of the laser device mounting frame 22 and the lead frame 23.

Although the semiconductor laser apparatus of the present invention is a frame type laser device formed by stamping out a frame from one metal plate, the overall form of a finished product is in the shape identical to the Φ5.6 can type laser apparatus as shown in FIG. 1. This enables the semiconductor laser apparatus to have compatibility with the Φ5.6 can type laser apparatus shown in FIG. 7.

Further, in the semiconductor laser apparatus in the present embodiment, the surrounding of the laser device 26 mounted on the laser device mounting frame 22 except the light emitting side is surrounded with the mold resin 29 that forms a component protecting partition. Consequently, although the overall form of the semiconductor laser apparatus is identical to the Φ5.6 can type laser apparatus, a cap for protecting the laser device and the wire in the Φ5.6 can type laser apparatus is unnecessary, and molding with resin enables mass production.

The semiconductor laser apparatus in the present invention is structured, as described above, such that the base frame 21, the laser device mounting frame 22 extensively provided from the connecting portion 21c of the base frame 21 to one side direction, and the lead frame 23a extensively provided from the connecting portion 21c to the other side direction are stamped out from one metal plate and bended. Therefore, the apparatus may be collectively produced in large quantities by the manufacturing steps identical to those in the case of the frame type laser apparatus. Hereinbelow, detailed description will be given of a method for manufacturing the semiconductor laser apparatus.

Figure 2A:
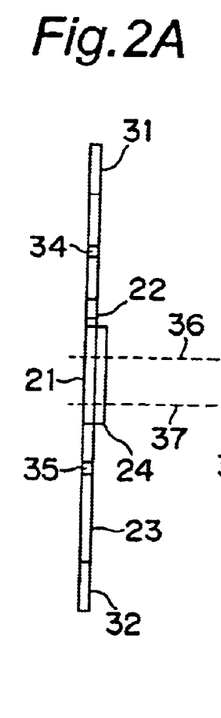
FIGS. 2A and 2B are views showing the form of a frame of the semiconductor laser apparatus shown in FIG. 1.
Figure 2B:
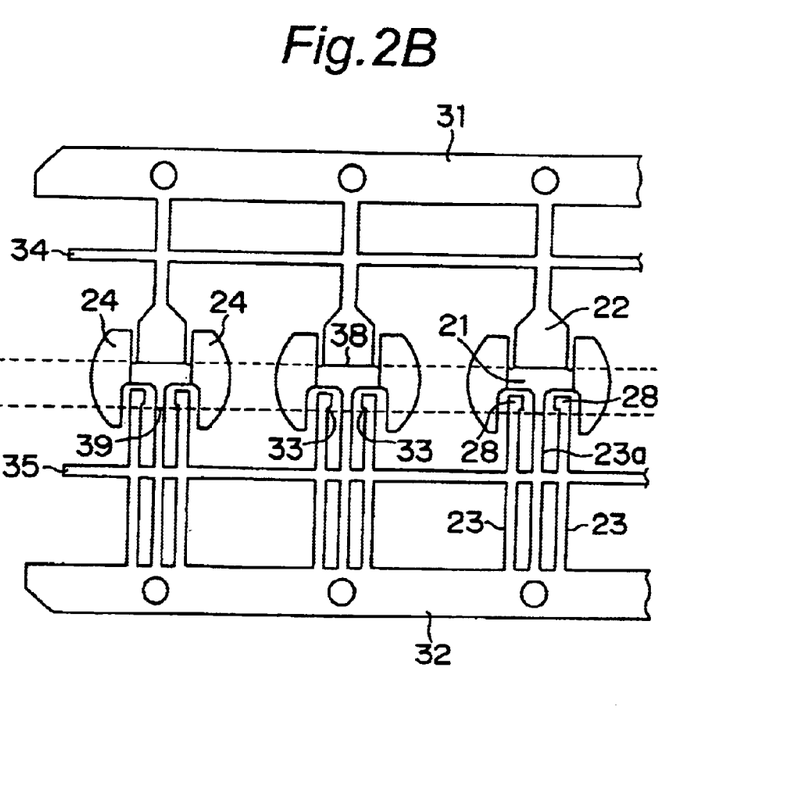

First, a plate material of the frame (mainly Cu and Ce) is stamped out to obtain a necessary form (including a positioning recess portion 30, and a slip out preventing step portion 33) as shown in FIG. 2. In FIG. 2, FIG. 2A is a side view showing a stamped frame, while FIG. 2B is a plane view showing the stamped frame.

In FIG. 2, two casing frames 31, 32 are disposed in parallel, and one end of a laser device mounting frame 22 extensively provided from a base frame 21 in one side direction is connected to one casing frame 31. Further, one end of a lead frame 23a extensively provided from the base frame 21 in the other side direction is connected to the other casing frame 32. From the casing frame 32, there are extensively provided two lead frames 23, 23 on the both sides of the lead frame 23a in parallel to the lead frame 23a.

In wire-bonding portions 28, 28 at the lower side of the top end portion of these two lead frames 23, 23, there is provided a slip out preventing step portion 33 for preventing the frames from slipping out of a mold resin 29 in which the frames are embedded later.

Plural sets of the laser device mounting frame 22, the base frame 21, and the lead frames 23, 23a, 23 are provided together and formed in the state of being connected to two casing frames 31, 32. The laser device mounting frame 22 of each set is connected to each other by a tie-bar 34 for reinforcement. Similarly, the lead frame 23a and the lead frames 23, 23 in every set, as well as the lead frames 23, 23a, 23 of each set are connected to each other by a tie-bar 35 for reinforcement.

In the frame stamped in the above form, the laser device mounting frame 22 is bended as described above in the position of a broken line 36 going through a border between the laser device mounting frame 22 and the base frame 21. Similarly, the lead frame 23a is bended as described above in the position of a broken line 37 going in the vicinity of the slip out preventing step portion 33 of the lead frames 23, 23. In this case, reference plane portions 21a, 21b of the base frame 21 are remained flat without being bended.

In the above-described stamping process, in the bending position of the laser device mounting frame 22 and the lead frame 23a, there are provided a shallow V groove 38 and V groove 39 having V-shaped cross section along the broken lines 36, 37 on the face opposite to each other by means of a mold for smooth operation of later frame forming. Also, the surface of the frame is plated with gold or silver for achieving good wire-bonding after completion of the stamping process. If further improve of heat dissipation and reference plane strength is necessary, metal plates 24, 24 for heat dissipation and reinforcement having the form identical to the reference plane portions 21a, 21b are attached to the reference plane portions 21a, 21b of the base frame 21 with adhesives after the plating process.

Figure 3:
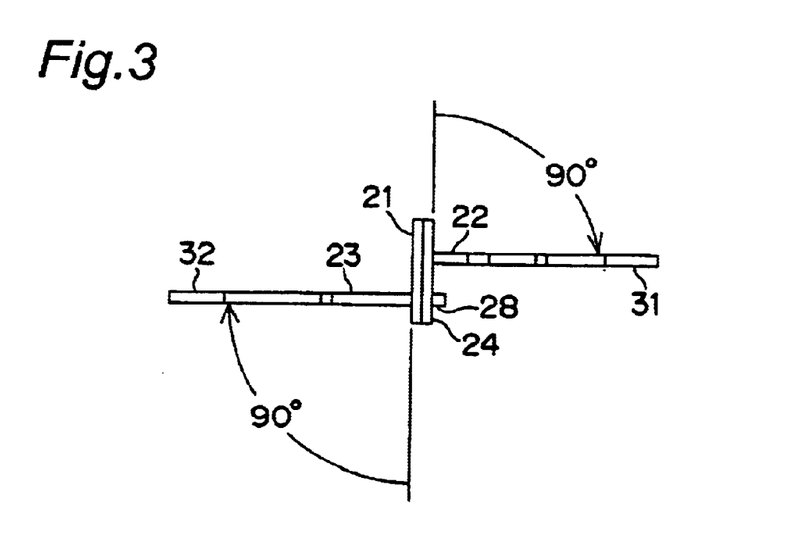
FIG. 3 is a side view showing the frame after forming.

After the frame are plated and the metal plates 24, 24 for heat dissipation and reinforcement are attached thereto as described above, there is performed forming process for forming the frames into a specified form through bending with use of a forming mold and the like. As a result, as shown in FIG. 3, the laser device mounting frame 22 is bended 90 degrees from the V groove 38 formed on the border between the laser device mounting frame 22 and one side edge of the connecting portion 21c of the base frame 21 with the V groove 38 as a folding valley. Similarly, the lead frame 23a is bended 90 degrees to the side opposite to the laser device mounting frame 22 from the V groove 39 formed on the border between the lead frame 23a and the other side edge of the connecting portion 21c with the V groove 39 as a folding valley. In this case, the reference plane portions 21a, 21b of the base frame 21 are remained flat.

It is noted that the forming process is performed such that in mounting a laser device 26 after completion of the forming process, an optical axis of light from the laser device 26 has an extension line traveling through an approximate center of the configuration of the base frame 21. More specifically, the forming process is performed so that the position of a laser emitting point in the plane view is the central position of the configuration of the approximately oval-shaped base frame 21 that is partially in the shape of a circular arc (see FIG. 1A). Consequently, when the base frame 21 is rotated to adjust mounting position (laser light emitting direction), the optical axis will not displace, which is advantageous for the apparatus.

Figure 4A:
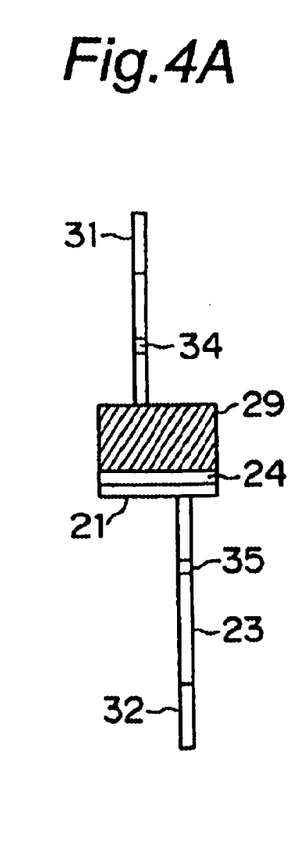
FIGS. 4A and 4B are views showing the frame being resin-molded.
Figure 4B:
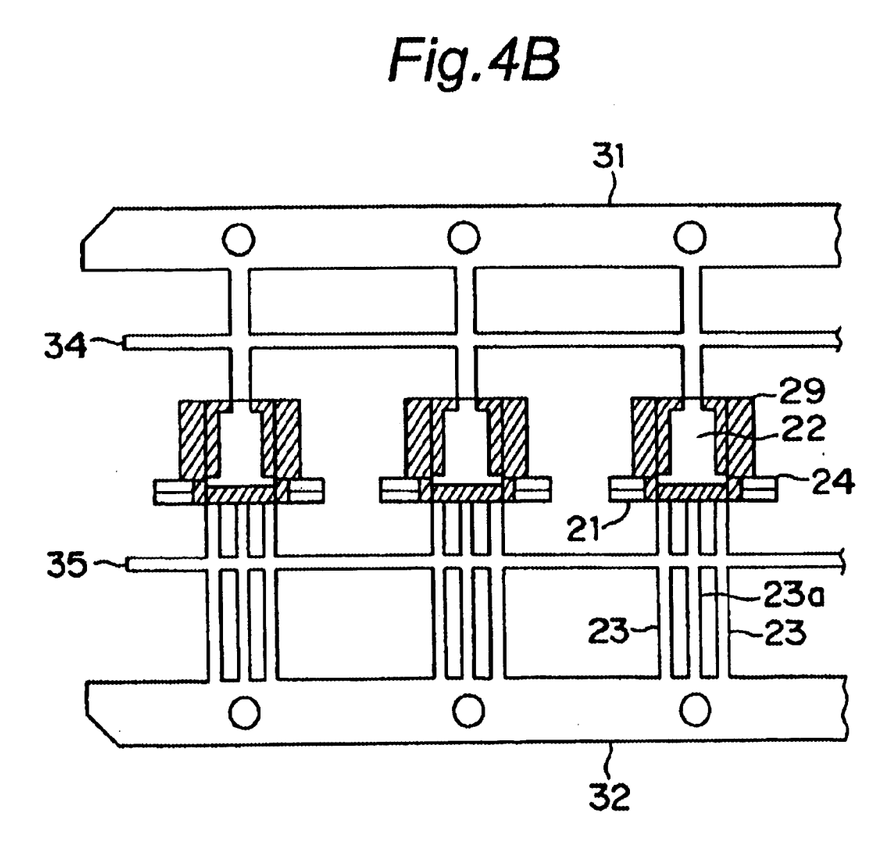

After that, the laser device 26 and a light receiving device 40 are mounted on the laser device mounting frame 22, and wire-bonded to the wire-bonding portions 28, 28 that form the slip out preventing step portion 33 in the top end portion of the two lead frames 23, 23 positioned outside and to the laser device mounting frame 22. Then, as shown in FIG. 4, the surrounding of the laser device 26 (omitted in FIG. 4) except the emitting side is molded with a mold resin 29 to form a component protecting partition for protecting the laser device 26, the wire 27, and the like. Here, the mold resin 29 is formed as shown in FIG. 1 with part of the laser device mounting frame 22 and the lead frame 23 being embedded therein so as to fix the bended laser device mounting frame 22 and the lead frame 23. Further, the slip out preventing step portion 33 provided in the top edge portion of the lead frame 23 secures the lead frame 23 so that the lead frame 23 does not slip out of the mold resin 29.

As described above, plural sets of the laser device mounting frame 22, the base frame 21, and the lead frame 23 are disposed parallelly and integrally with two casing frames 31, 32 disposed in parallel, and formed by stamping from one metal plate. Therefore, the later steps of forming, mounting of the laser device 26, wire-bonding, and resin molding may be performed simultaneously for plural sets, which enables collective mass production.

It is noted that in the above embodiment, to the reference plane portions 21a, 21b of the base frame 21, there are attached the metal plates 24, 24 having the same form for securing strength and heat dissipation of the reference plane. However, stamping may be conducted with use of a metal plate having a thickness equal to the sum of the thickness of the base frame 21 and the thickness of the metal plates 24, 24. In this case, in the stamping process, the laser device mounting frame 22, the connecting portion 21c of the base frame 21, and the lead frame 23 are rolled out by pressing. Alternatively, V grooves 38, 39 may be formed after the stamping process, and in the process of forming the V grooves 38, 38, the laser device mounting frame 22, the connecting portion 21c of the base frame 21, and the lead frame 23 may be rolled out.

This invention is for parallelly disposing plural sets of the laser device mounting frame 22, the base frame 21, and the lead frame 23 integrally with the casing frames 31, 32 and stamping them from one metal plate. Then, the laser device mounting frame 22 is bended 90 degrees against the base frame 21 in one direction, while the lead frame 23 is bended 90 degrees on the opposite side of the laser device mounting frame 22 to form flat reference plane portions 21a, 21b in the base frame 21. Then, the laser device 26 is mounted on the laser device mounting frame 22 and molded with resin.

Therefore, as long as the above structure is provided, the specific form of the laser device mounting frame 22, the base frame 21 and the lead frame 23, the number of the lead frames, the disposition, form, and number of the casing frame, the form of the mold resin 29, the form of the entire frame are not limited to the above embodiment.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser apparatus, comprising:
   base frame;
   laser device mounting frame extensively disposed on one side of the base frame; and a first lead frame extensively disposed on the other side of the base frame, structured by one metal plate, wherein the laser device mounting frame and the first lead frame are rectangularly bent relative to a plane of the base frame so as to be opposite to each other against the plane of the base frame, the base frame is configured as a reference plane and a heatsink base, a semiconductor laser device is mounted on the laser device mounting frame, and the first lead frame becomes a lead terminal.

2. The semiconductor laser apparatus as defined in claim 1, wherein a configuration of the base frame is an approximate circle or an approximate oval partially in a shape of a circular arc.

3. The semiconductor laser apparatus as defined in claim 2, wherein an optical axis of laser light from the semiconductor laser device mounted on the laser device mounting frame has an extension line traveling through an approximate center of the configuration of the base frame.

4. The semiconductor laser apparatus as defined in claim 1, wherein at least a portion of the base frame to be the reference plane and the heatsink base has an increased thickness.

5. The semiconductor laser apparatus as defined in claim 1, wherein the base frame further comprises a resin component protecting partition so as to surround the semiconductor laser device excluding a laser emitting side.

6. The semiconductor laser apparatus as defined in claim 5, wherein the resin structuring the component protecting partition is formed with at least part of the laser device mounting frame and the first lead frame being embedded therein, and the laser device mounting frame and the first lead frame bent toward the base frame are fixed by the resin.

7. The semiconductor laser apparatus as defined in claim 5, further comprising a second lead frame formed separately from the first lead frame that is integrally formed with the base frame, wherein a top end portion of the second lead frame is inserted into the resin that constitutes the component protecting partition, and the top end portion is equipped with a slip out preventing device for preventing slip out of the second lead frame from the resin.

8. The semiconductor laser apparatus as defined in claim 1, wherein a positioning recess portion is provided on an outer circumferential edge of the base frame.

9. The semiconductor laser apparatus as defined in claim 1, wherein the base frame, the laser device mounting frame and the first lead frame are formed from a copper plate or an iron plate having a surface plated with gold or silver.

10. A method for manufacturing a semiconductor laser apparatus, comprising;

forming plural groups of frames connected by at least a casing frame, the group composed of a base frame, a laser device mounting frame extensively disposed on one side of the base frame, a first lead frame extensively disposed on the other side of the base frame, and a second frame separated from the first lead frame;

rectangularly bending the laser device mounting frame and the first lead frame in each group relative to the base frame so as to be opposite to each other against the base frame;

mounting the semiconductor laser device on the laser device mounting frame in each group, and then wire-bonding the semiconductor laser device to the first and second lead frames; and forming a component protecting partition from resin on the base frame in each group so as to surround the semiconductor laser device excluding a laser emitting side.

11. The method for manufacturing a semiconductor laser device as defined in claim 10, wherein forming of frames from one metal plate is conducted by stamping with use of a mold.

12. The method for manufacturing a semiconductor laser device as defined in claim 10, further comprising the step of providing a groove in a bending portion of each frame in advance of the step of bending the laser device mounting frame and the first lead frame.

13. The method for manufacturing a semiconductor laser device as defined in claim 10, wherein bending of the laser device mounting frame and the first lead frame is conducted with use of a mold.

14. The method for manufacturing a semiconductor laser device as defined in claim 10, further comprising the step of attaching a metal plate to at least a portion of the base frame to be a reference plane and a heatsink base, the metal plate having a form identical to the portion.

15. The method for manufacturing a semiconductor laser device as defined in claim 10, further comprising the step of decreasing a thickness of a portion other than the portion of the base frame to be the reference plane and the heatsink base, a thickness of the laser device mounting frame, and a thickness of the first lead frame by pressing.

* * * * *